United States Patent
Miura et al.

(10) Patent No.: US 7,695,895 B2
(45) Date of Patent: Apr. 13, 2010

(54) ALKALI-DEVELOPABLE PHOTOSENSITIVE COLOR COMPOSITION

(75) Inventors: Hiroyuki Miura, Tokyo (JP); Kazushige Kitazawa, Tokyo (JP); Hideyuki Yamada, Tokyo (JP); Masahide Tsuzuki, Tokyo (JP); Ryota Chiba, Tokyo (JP)

(73) Assignees: Toppan Printing Co., Ltd., Tokyo (JP); Adeka Corporation, Tokyo (JP)

( * ) Notice: Subject to any disclaimer, the term of this patent is extended or adjusted under 35 U.S.C. 154(b) by 242 days.

(21) Appl. No.: 11/792,228

(22) PCT Filed: Jul. 19, 2006

(86) PCT No.: PCT/JP2006/314227
§ 371 (c)(1),
(2), (4) Date: Jun. 4, 2007

(87) PCT Pub. No.: WO2007/010918
PCT Pub. Date: Jan. 25, 2007

(65) Prior Publication Data
US 2007/0292805 A1 Dec. 20, 2007

(30) Foreign Application Priority Data
Jul. 20, 2005 (JP) ............................... 2005-209886

(51) Int. Cl.
*G03F 7/038* (2006.01)
(52) U.S. Cl. ................. 430/284.1; 430/285.1; 430/907; 430/292; 430/7; 522/95
(58) Field of Classification Search ................ None
See application file for complete search history.

(56) References Cited

U.S. PATENT DOCUMENTS

| 4,487,893 | A | * | 12/1984 | Yamabe et al. ............... 525/386 |
| 5,712,022 | A | * | 1/1998 | Tanaka et al. ............ 428/195.1 |
| 7,041,416 | B2 | | 5/2006 | Wakata et al. |
| 2003/0129504 | A1 | * | 7/2003 | Wakata et al. .................. 430/5 |
| 2003/0224288 | A1 | * | 12/2003 | Kodama .................. 430/270.1 |

FOREIGN PATENT DOCUMENTS

| JP | 5-179185 A | 7/1993 |
| JP | 7035915 | 2/1995 |
| JP | 8-76379 A | 3/1996 |
| JP | 9-211860 A | 8/1997 |
| JP | 10-97070 A | 4/1998 |
| JP | 10-168143 A | 6/1998 |
| JP | 11-242331 A | 9/1999 |
| JP | 11281815 | 10/1999 |
| JP | 11-343394 A | 12/1999 |
| JP | 2000-355621 A | 12/2000 |
| JP | 2001-247649 A | 9/2001 |
| JP | 2003-270786 A | 9/2003 |
| JP | 2004-264773 A | 9/2004 |
| JP | 2004-295084 A | 10/2004 |
| JP | 2005-77451 A | 3/2005 |

OTHER PUBLICATIONS

English translation of JP, 2004-295084, A (2004) from machine translation from AIPN Japan Patent Office National center for Industrial Property Information and Training, generated Jan. 1, 2009, 28 pages.*

* cited by examiner

*Primary Examiner*—Cynthia Hamilton
(74) *Attorney, Agent, or Firm*—Young & Thompson

(57) ABSTRACT

An alkali-developable photosensitive color composition containing a binder resin, a fluorine-containing copolymer, a photopolymerization initiator, a colorant, and a solvent. A photopolymerizable unsaturated compound is used as the binder resin. The photopolymerizable unsaturated compound is obtained by adding (B) an unsaturated monobasic acid to (A) a polyfunctional epoxy resin to form (C) an epoxy adduct and allowing the epoxy adduct (C) and (D) a polybasic acid anhydride to react with each other.

17 Claims, No Drawings

ALKALI-DEVELOPABLE PHOTOSENSITIVE COLOR COMPOSITION

TECHNICAL FIELD

This invention relates to an alkali-developable photosensitive color composition useful in the manufacture of color filters for color liquid crystal displays (LCDs), image sensors, etc.

BACKGROUND ART

An alkali-developable photosensitive color composition containing an alkali-soluble binder resin having an ethylenically unsaturated bond, a photopolymerization initiator, a colorant such as a pigment or a dye, and a solvent is widely used in the manufacture of a color filter, a key component of color LCDs, image sensors, etc.

Manufacturing a color filter using an alkali-developable photosensitive color composition generally includes the following steps. An alkali-developable photosensitive color composition containing a black colorant is applied to a substrate, exposed to light through a photomask having a prescribed pattern, and developed to remove unexposed areas of the applied color composition thereby forming a black matrix for a color filter. The development is usually followed by a heat treatment to enhance the mechanical strength. Color pixels are then successively formed on the substrate using alkali-developable photosensitive color compositions containing the respective colorants (red, green, and blue) in the same manner as with the black colorant-containing alkali-developable photosensitive color composition.

Various methods are available to form the pixels of each color, including a pigment dispersion method, a dyeing method, an electrodeposition method, and an inkjet method. Above all, the inkjet method is a lately proposed convenient technique.

With respect to color filter production by the inkjet method, Patent Document 1 discloses a color filter having a black matrix containing a fluorine-containing compound, and Patent Document 2 discloses a resin composition for color filters that contains a fluorine-containing copolymer and a fluorine-containing organic compound.

Patent Document 1: Japanese Patent No. 3470352

Patent Document 2: Japanese Patent No. 3644243

However, an alkali-developable photosensitive resin composition comprising the disclosed alkali-developable resin composition containing a fluorine-containing compound, a fluorine-containing copolymer, or a fluorine-containing organic compound has a disadvantage of poor coating properties in inkjet pixel patterning such that the colorant tends to diffuse out of an intended area because of the poor ink repellency or to cause display unevenness. Besides, the composition has poor alkali developability.

DISCLOSURE OF THE INVENTION

Problems to be Solved by the Invention

The problem to be solved is that we have so far no alkali-developable photosensitive color composition that exhibits excellent ink repellency and alkali developability to efficiently realize accurate and precise patterning while retaining such characteristics as sensitivity, resolution, transparency, adhesion, and alkali resistance.

An object of the present invention is to provide an alkali-developable photosensitive color composition free of the above problem.

Means for Solving the Problems

The above object of the invention is accomplished by the provision of an alkali-developable photosensitive color composition containing a binder resin, a fluorine-containing copolymer, a photopolymerization initiator, a colorant, and a solvent, the binder resin comprising a photopolymerizable unsaturated compound obtained by adding (B) an unsaturated monobasic acid to (A) a polyfunctional epoxy resin to form (C) an epoxy adduct and reacting the epoxy adduct and (D) a polybasic acid anhydride.

BEST MODE FOR CARRYING OUT THE INVENTION

The alkali-developable photosensitive color composition of the invention will be described in detail with reference to its preferred embodiments.

The alkali-developable photosensitive color composition of the invention contains a binder resin, a fluorine-containing copolymer, a photopolymerization initiator, a colorant, and a solvent.

The binder resin that can be used in the alkali-developable photosensitive color composition of the invention comprises a photopolymerizable unsaturated compound obtained by adding (B) an unsaturated monobasic acid to (A) a polyfunctional epoxy resin to form (C) an epoxy adduct and allowing the epoxy adduct and (D) a polybasic acid anhydride to react with each other.

Examples of the fluorine-containing copolymer include one obtained by preparing (G) a block copolymer having a fluorine-containing segment A derived from (E) at least one fluoromonomer and a fluorine-free segment B derived from (F) at least one fluorine-free monomer and having a hydroxyl group in the segment A and/or the segment B and modifying part of, or the whole of, the hydroxyl groups of the block copolymer (G) with (D') a polybasic acid anhydride.

Preferred examples of the fluoromonomer (E) include those represented by general formula (I) or (II):

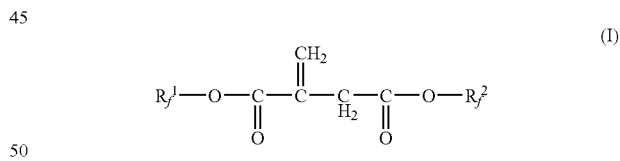

wherein $R_f^1$ and $R_f^2$ each represent a fluoroalkyl group having 1 to 30 carbon atoms and optionally having a hydroxyl group.

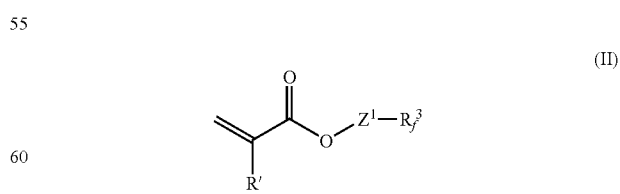

wherein R' represents a hydrogen atom or a methyl group; $Z^1$ represents a direct bond or a group selected from —R"—NR—SO$_2$—, —R"—NR—CO—, —CH$_2$—CH(OH)—CH$_2$—, and —CH$_2$—CH(OH)—CH$_2$—O—; R" represents an alkylene group having 1 to 4 carbon atoms; $R_f^3$ has the same meaning as $R_f^2$ of general formula (I); and R represents a hydrogen atom or an alkyl group having 1 to 30 carbon atoms and optionally having a hydroxyl group.

Examples of the fluoroalkyl group represented by $R_f^1$, $R_f^2$, and $R_f^3$ of general formulae (I) and (II), which has 1 to 30 carbon atoms and may have a hydroxyl group, include $F(CF_2)_6(CH_2)_2$, $F(CF_2)_8(CH_2)_2$, $F(CF_2)_{10}(CH_2)_2$, $H(CF_2)_8CH_2$, $(CF_3)_2CF(CF_2)_6(CH_2)_2$, $(CF_3)_2CF(CF_2)_8(CH_2)_2$, $F(CF_2)_6(CF_2)_2$, $F(CF_2)_8(CF_2)_2$, $F(CF_2)_{10}(CF_2)_2$, $H(CF_2)_8CF_2$, $(CF_3)_2CF(CF_2)_6(CF_2)_2$, $F(CF_2)_8(CH_2)_2$, $F(CF_2)_8$, $F(CF_2)_6CH(OH)CH_2$, $F(CF_2)_8CH_2CH(OH)CH_2$, and $(CF_3)_2CF(CF_2)_2CH_2CH(OH)CH_2$. Particularly preferred of them are $F(CF_2)_8(CH_2)_2$ and $F(CF_2)_8$. In general formula (II), examples of the alkyl group represented by R, which has 1 to 30 carbon atoms and may have a hydroxyl group, include methyl, ethyl, propyl, isopropyl, butyl, sec-butyl, tert-butyl, isobutyl, amyl, isoamyl, tert-amyl, hexyl, cyclohexyl, cyclohexylmethyl, cyclohexylethyl, heptyl, isoheptyl, tert-heptyl, n-octyl, isooctyl, tert-octyl, 2-ethylhexyl, decyl, isodecyl, undecyl, lauryl, dodecyl, hexadecyl, stearyl, behenyl, glycidyl, 2-hydroxyethyl, 3-hydroxypropyl, and 2-hydroxypropyl. Examples of the alkylene group having 1 to 4 carbon atoms as represented by R" include methylene, ethylene, propylene, butylene, and methylethylene.

Examples of the fluoromonomer (E) further include, in addition to those represented by general formula (I) or (II), polyvinylidene fluoride, fluoroolefin-vinyl ether copolymers, trifluoroethylene-vinylidene fluoride copolymers, polytetrafluoroethylene, perfluoroethylenepropylene, and perfluoroalkoxys.

The fluorine-free monomer is preferably a (meth)acrylic monomer, particularly a (meth)acrylic monomer represented by general formula (V) or (VI):

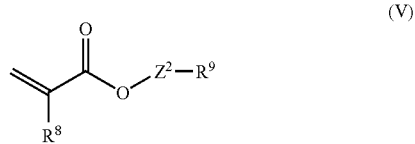

(V)

wherein $R^8$ represents a hydrogen atom or a methyl group; $R^9$ represents an alkyl group having 1 to 30 carbon atoms and optionally having a hydroxyl group, a cycloalkyl group having 3 to 30 carbon atoms and optionally having a hydroxyl group or an aryl group having 6 to 30 carbon atoms and optionally having a hydroxyl group; and $Z^2$ has the same meaning as $Z^1$ in general formula (II).

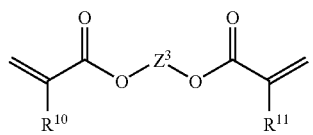

(VI)

wherein $R^{10}$ and $R^{11}$ each have the same meaning as $R^8$ of general formula (V); and $Z^3$ represents an alkylene group having 2 to 8 carbon atoms.

In general formula (V), examples of the C3 to C30 alkyl group that may have a hydroxyl group as represented by $R^9$ include the substituents represented by R in general formula (II). Examples of the C6 to C30 cycloalkyl group that may have a hydroxyl group as represented by $R^9$ include cyclopropyl, cyclobutyl, cyclopentyl, cyclohexyl, methylcyclohexyl, cycloheptyl, cyclooctyl, cyclononyl, cyclodecyl, 1-hydroxycyclohexyl, 2-hydroxycyclohexyl, 3-hydroxycyclohexyl, and 4-hydroxycyclohexyl. Examples of the C1 to C30 aryl group that may have a hydroxyl group as represented by $R^9$ include phenyl, naphthyl, 2-methylphenyl, 3-methylphenyl, 4-methylphenyl, 4-vinylphenyl, 3-isopropylphenyl, 4-isopropylphenyl, 4-butylphenyl, 4-isobutylphenyl, 4-tert-butylphenyl, 4-hexylphenyl, 4-cyclohexylphenyl, 4-octylphenyl, 4-(2-ethylhexyl)phenyl, 4-stearylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,4-di-tert-butylphenyl, 2,5-di-tert-butylphenyl, 2,6-di-tert-butylphenyl, 2,4-di-tert-pentylphenyl, 2,5-di-tert-amylphenyl, 2,5-di-tert-octylphenyl, 2,4-dicumylphenyl, cyclohexylphenyl, biphenyl, 2,4,5-trimethylphenyl, benzyl, phenethyl, 2-phenylpropan-2-yl, diphenylmethyl, triphenylmethyl, styryl, cinnamyl, 2-phenylpropan-2-yl, diphenylmethyl, 2-hydroxyphenyl, 3-hydroxyphenyl, and 4-hydroxyphenyl.

In general formula (VI), examples of the alkylene group represented by $Z^3$ include ethylene methylene, ethylene, propylene, butylene, methylethylene, pentylene, hexylene, heptalene, and octylene.

Examples of the fluorine-free monomer (F) further include, in addition to the (meth)acrylic monomers of general formula (V) or (VI), fumaric esters such as diisopropyl fumarate, dicyclohexyl fumarate, di-tert-butyl fumarate, diisobutyl fumarate, and dibenzyl fumarate; hydroxyl-containing vinyl monomers such as 2-hydroxyethyl(meth)acrylate, 2-hydroxypropyl(meth)acrylate, and allyl alcohol; carboxyl-containing vinyl monomers such as (meth)acrylic acid, itaconic acid, fumaric acid, maleic acid, citraconic acid, vinyl benzoic acid, crotonic acid, maleic acid, and fumaric acid; amido-containing vinyl monomers such as (meth)acrylamide, N-methylol(meth)acrylamide, N,N-dimethyl(meth)acrylamide, and N-(meth)acryloylmorpholine; polyethylene glycol (meth) acrylic acid esters such as triethylene glycol (meth)acrylate; polypropylene glycol esters such as dipropylene glycol (meth)acrylate; aromatic vinyl monomers such as styrene, vinyltoluene, and α-methylstyrene; carboxylic acid vinyl esters such as vinyl formate, vinyl acetate, vinyl propionate, and vinyl stearate; (meth)acrylic acid esters of alcohols having a tertiary amino group such as N,N-dimethylaminoethyl(meth)acrylate and N,N-dimethylaminopropyl(meth)acrylate; N,N-dimethylamino(meth)acrylate; and quaternary ammonium salts derived from (meth)acrylic acid, such as 2-hydroxy-3-methacryloxypropyltrimethylammonium chloride, N,N-dimethylaminoethyl(meth)acrylate hydrochloride, and N,N-dimethylaminopropyl (meth)acrylate hydrochloride.

The block copolymer (G) has a hydroxyl group in the segment A and/or the segment B. The block copolymer (G) having a hydroxyl group in the segment A is obtained by using at least one monomer having a hydroxyl group as the fluoromonomer (E). The block copolymer (G) having a hydroxyl group in the segment B is obtained by using at least one monomer having a hydroxyl group as the fluorine-free monomer (F). It is preferred that a hydroxyl group be present in only the segment B because the presence of a hydroxyl group in the segment A can impair the effects of fluorine, such as the ink repellency of the fluorine-containing copolymer. The most easy way to introduce a hydroxyl group into the segment B is to use a (meth)acrylic ester having a hydroxyl group on its ester moiety as the fluorine-free monomer (F). For example, an ester between diethylene glycol and (meth)acrylic acid or an alcohol adduct of glycidyl (meth)acrylate can be used.

Examples of the polybasic acid anhydride (D') include succinic anhydride, maleic anhydride, trimellitic anhydride, pyromellitic anhydride, 2,2'-3,3'-benzophenonetetracarboxylic acid anhydride, 3,3'-4,4'-benzophenonetetracarboxylic acid anhydride, ethylene glycol bisanhydrotrimellitate, glycerol trisanhydrotrimellitate, phthalic anhydride, hexahydrophthalic anhydride, methyltetrahydrophthalic anhydride, tetrahydrophthalic anhydride, nadic anhydride, methylnadic anhydride, trialkyltetrahydrophthalic anhydrides, hexahydrophthalic anhydride 5-(2,5-dioxotetrahydrofuryl)-3-methyl-3-cyclohexene-1,2-dicarboxylic acid anhydride, trialkyltetrahydrophthalic anhydride-maleic anhydride adducts, dodecenylsuccinic anhydride, and methylhymic anhydride. Preferred of them are succinic anhydride, trimellitic anhydride, and tetrahydrophthalic anhydride.

The fluorine-containing copolymer has a fluoromonomer (E) to fluorine-free monomer (F) mass ratio of 10/90 to 80/20, preferably 15/85 to 60/40. When the fluoromonomer (E) is less than 10% by mass, the ink repellency is likely to be reduced. When it is more than 60% by mass, the fluorine-containing copolymer is likely to have reduced solubility in a solvent.

The fluorine-containing copolymer has a mass average molecular weight of 10,000 to 100,000, preferably 20,000 to 50,000. The fluorine-containing copolymer with a mass average molecular weight less than 10,000 may have reduced production efficiency. The fluorine-containing copolymer with a mass average molecular weight exceeding 100,000 is difficult to produce on an account of poor solvent solubility. The term "mass average molecular weight" as used herein is a polystyrene equivalent molecular weight.

The fluorine-containing copolymer has an acid value of 20 mgKOH/g or more, preferably 30 mgKOH/g or more. The fluorine-containing copolymer having an acid value smaller than 20 mgKOH/g tends to provide an alkali-developable photosensitive color composition having reduced developability.

A preferred example of the polyfunctional epoxy resin (A) is an alkylidenebisphenol polyglycidyl ether epoxy resin represented by general formula (III):

to 10 carbon atoms; $Y^2$ represents an alkyl group having 1 to 10 carbon atoms, an alkoxy group having 1 to 10 carbon atoms, an alkenyl group having 2 to 10 carbon atoms or a halogen atom, wherein the alkyl, the alkoxy and the alkenyl groups may be substituted with a halogen atom; and p represents a number of from 0 to 4.

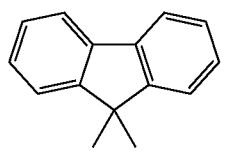

(BB)

In general formula (III), examples of the C1 to C4 alkylidene group represented by $Z^4$ include methylene, ethylene, propylidene, isopropylidene, butylidene, and isobutylidene. Examples of the alicyclic hydrocarbon group as represented by $Z^4$ include cyclopropylidene, cyclopentylidene, cyclohexylidene, and 4-chlorocyclohexylidene.

Examples of the C1 to C5 alkyl group represented by $R^1$, $R^2$, $R^3$ or $R^4$ include methyl, ethyl, propyl, isopropyl, butyl, isobutyl, sec-butyl, tert-butyl, pentyl, isoamyl and tert-amyl. Examples of the C1 to C8 alkoxy group represented by $R^1$, $R^2$, $R^3$ or $R^4$ include methoxy, ethoxy, propoxy, isopropoxy, butoxy, sec-butoxy, tert-butoxy, isobutoxy, amyloxy, isoamyloxy, tert-amyloxy, hexyloxy, cyclohexyloxy, heptyloxy, isoheptyloxy, tert-heptyloxy, n-octyloxy, isooctyloxy, tert-octyloxy, and 2-ethylhexyloxy. Examples of the C2 to C5 alkenyl group represented by $R^1$, $R^2$, $R^3$ or $R^4$ include vinyl, 1-meth-

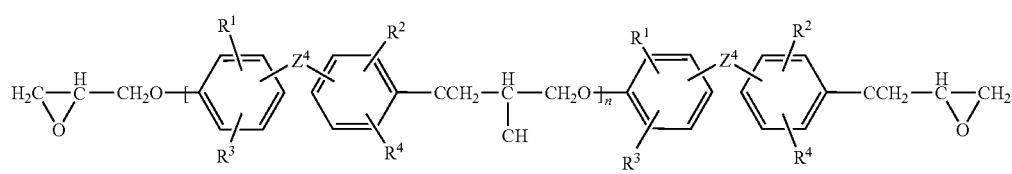

(II)

wherein $Z^4$ represents a direct bond, a methylene group, an alkylidene group having 1 to 4 carbon atoms, an alicyclic hydrocarbon group, O, S, $SO_2$, SS, SO, CO, OCO, a substituent represented by formula (AA) shown below or a substituent represented by formula (BB) shown below, wherein the alkylidene group may be substituted with a halogen atom; $R^1$, $R^2$, $R^3$, and $R^4$ each represent a hydrogen atom, an alkyl group having 1 to 5 carbon atoms, an alkoxy group having 1 to 8 carbon atoms, an alkenyl group having 2 to 5 carbon atoms or a halogen atom, wherein the alkyl, the alkoxy, and the alkenyl groups may be substituted with a halogen atom; and n represents an integer of from 0 to 10.

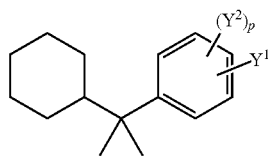

(AA)

wherein $Y^1$ represents a hydrogen atom, a phenyl group which may be substituted with an alkyl or alkoxy group having 1 to 10 carbon atoms, or a cycloalkyl group having 3 ylethenyl, 2-methylethenyl, 2-propenyl, 1-methyl-3-propenyl, 3-butenyl, 1-methyl-3-butenyl, isobutenyl, and 3-pentenyl. Examples of the halogen atom as represented by $R^1$, $R^2$, $R^3$ or $R^4$ include fluorine, chlorine, bromine, and iodine. The examples of the halogen atom as $R^1$, $R^2$, $R^3$ or $R^4$ also apply to the halogen atom that can substitute the hydrogen of the alkylidene group, the alkyl group, the alkoxy group, and the alkenyl group.

In formula (AA), examples of the C1 to C10 alkyl group as a substituent of the phenyl group represented by $Y^1$ and the C1 to C10 alkyl group represented by $Y^2$ include methyl, ethyl, propyl, isopropyl, cyclopropyl, butyl, sec-butyl, tert-butyl, isobutyl, amyl, isoamyl, tert-amyl, cyclopentyl, hexyl, 2-hexyl, 3-hexyl, cyclohexyl, bicyclohexyl, 1-methylcyclohexyl, heptyl, 2-heptyl, 3-heptyl, isoheptyl, tert-heptyl, n-octyl, isooctyl, tert-octyl, 2-ethylhexyl, nonyl, isononyl, and decyl. Examples of the C1 to C10 alkoxy group as a substituent of the phenyl group represented by $Y^1$ and the C1 to C10 alkoxy group represented by $Y^2$ include methoxy, ethoxy, propoxy, isopropoxy, butoxy, sec-butoxy, tert-butoxy, isobutoxy, amyloxy, isoamyloxy, tert-amyloxy, hexyloxy, cyclohexyloxy, heptyloxy, isoheptyloxy, tert-heptyloxy, n-octyloxy, isooctyloxy, tert-octyloxy, 2-ethylhexyloxy, nonyloxy, and decyloxy. Examples of the C3 to C10 cycloalkyl group represented by $Y^1$ include cyclopropyl, cyclobutyl, cyclopentyl, 2-methylcyclopentyl, cyclohexyl, and 4-chlorocyclohexyl. Examples of the C2 to C10 alkenyl group represented by $Y^2$ include vinyl, 1-methylethenyl, 2-methylethenyl, 2-propenyl, 1-methyl-3-propenyl, 3-butenyl, 1-methyl-3-butenyl, isobutenyl, 3-pentenyl, 4-hexenyl, heptenyl, octenyl, and decenyl. Examples of the halogen atom as represented by $Y^2$ and the halogen atom as a substituent of the alkyl group, the alkoxy group, and the alkenyl group include those recited above.

Another preferred example of the polyfunctional epoxy resin (A) is a phenol novolak epoxy resin represented by general formula (IV):

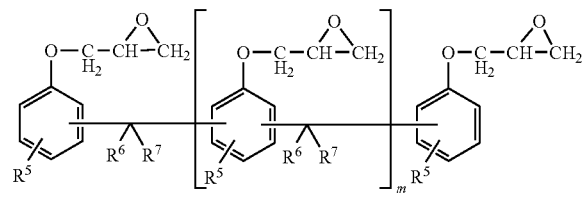

(IV)

wherein $R^5$ represents a hydrogen atom, an alkyl group having 1 to 5 carbon atoms, an alkoxy group having 1 to 8 carbon atoms, an alkenyl group having 2 to 5 carbon atoms, a halogen atom or a (4-glycidyloxyphenyl)-2,2-dimethylmethylidene group, wherein the alkyl, the alkoxy and the alkenyl groups may be substituted with a halogen atom; $R^6$ and $R^7$ each represent a hydrogen atom or a glycidyloxyphenyl group; and m represents an integer of from 0 to 10.

Examples of the C1 to C5 alkyl group, the C1 to C8 alkoxy group, the C2 to C5 alkenyl group, and the halogen atom as represented by $R^5$ in formula (IV), and examples of the halogen atom as a substituent of the alkyl, the alkoxy, and the alkenyl groups are the same as those described above.

A polyphenylmethane epoxy resin having a polyfunctional epoxy group is also useful as the polyfunctional epoxy resin (A).

Specific examples of the epoxy compounds represented by general formulae (III) and (IV) and the polyphenylmethane epoxy resin having a polyfunctional epoxy group include compound Nos. 1 through 20 listed below.

Compound No. 1

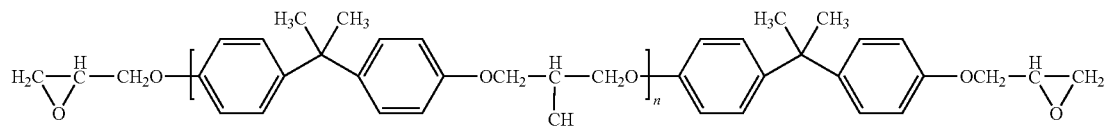

Compound No. 2

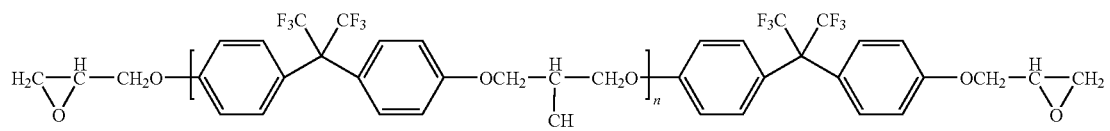

Compound No. 3

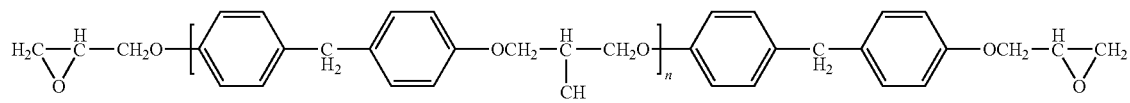

Compound No. 4

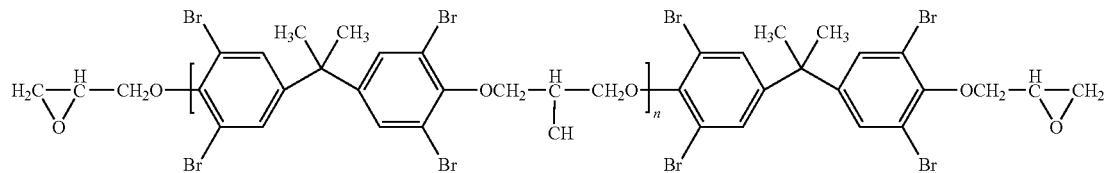

Compound No. 5

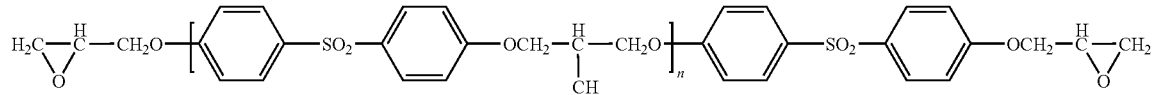

Compound No. 6

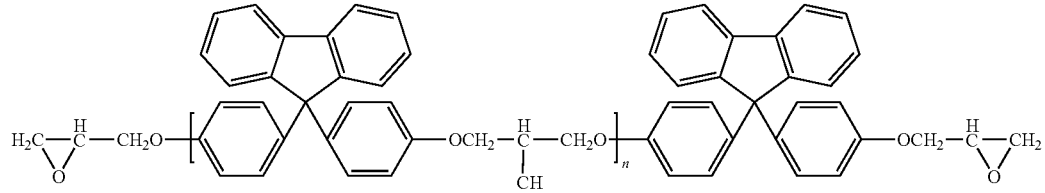

-continued
Compound No. 7
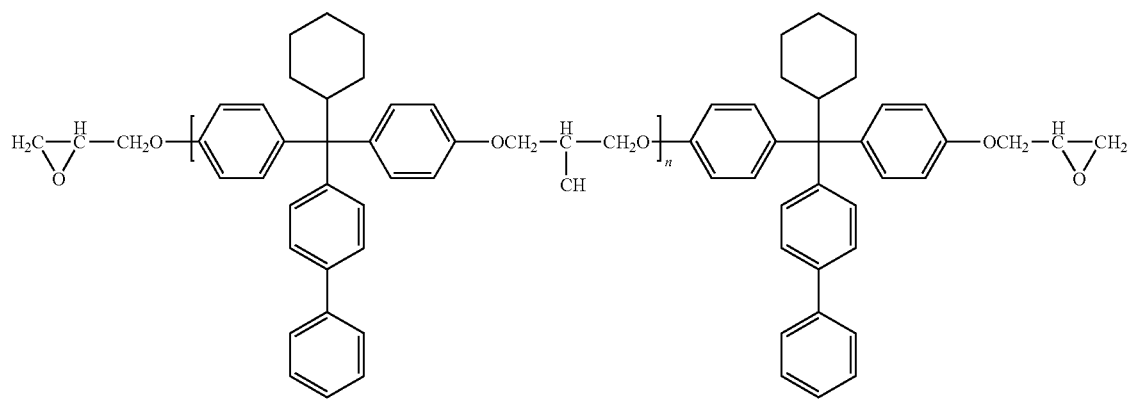
Compound No. 8
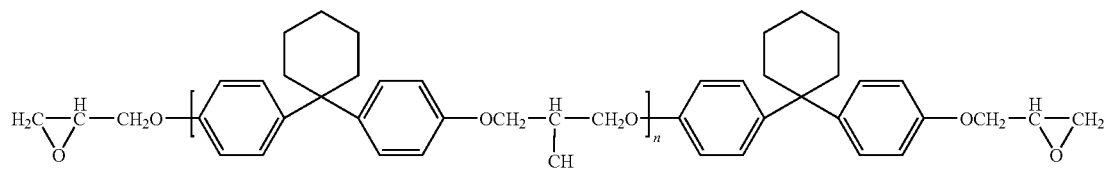
Compound No. 9
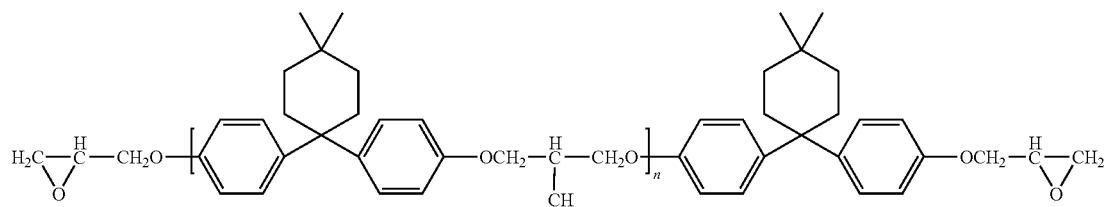
Compound No. 10
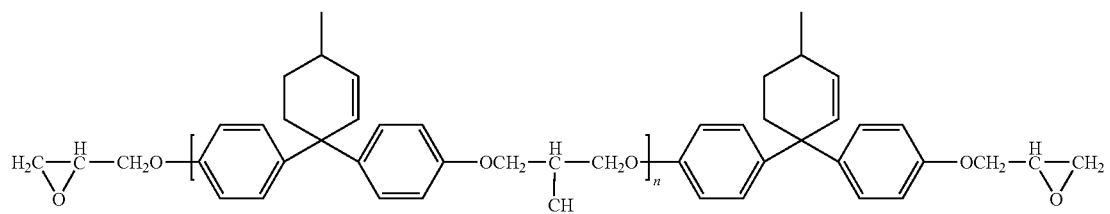
Compound No. 11
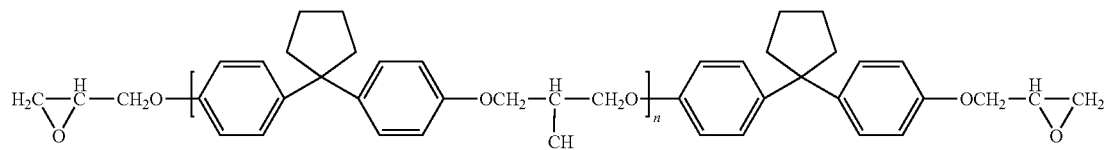
Compound No. 12
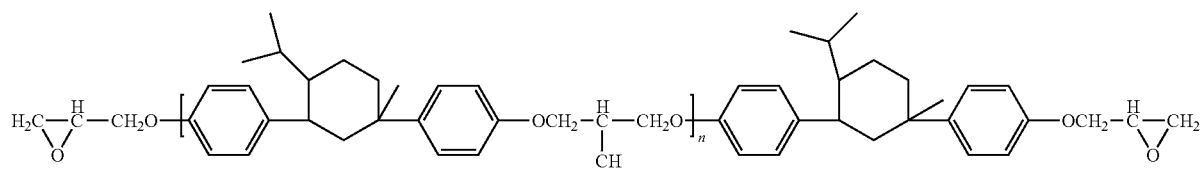
Compound No. 13
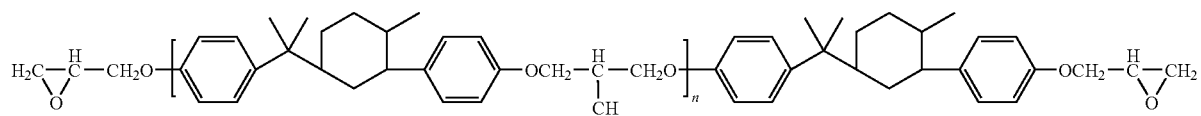

-continued
Compound No. 14
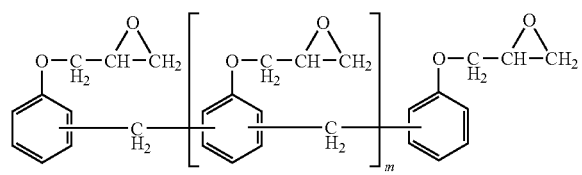
Compound No. 15
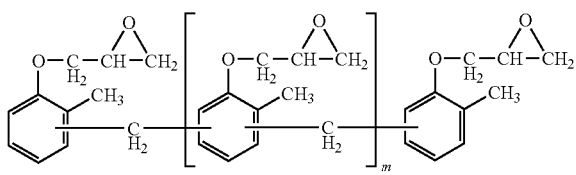
Compound No. 16
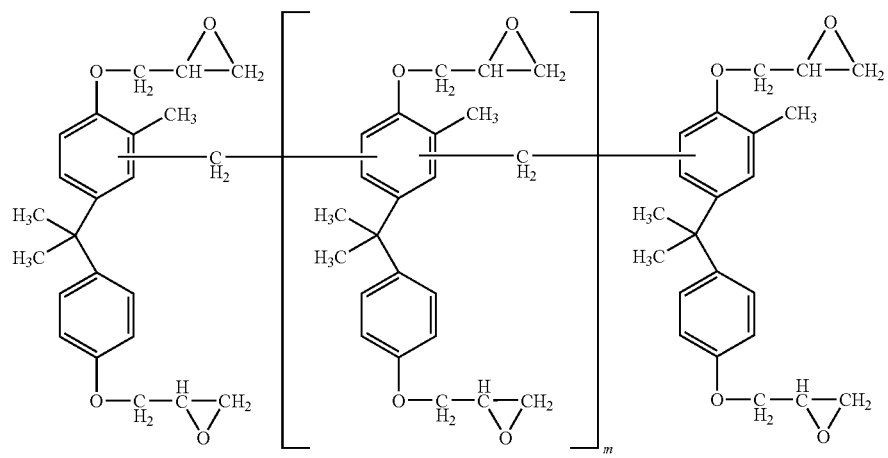
Compound No. 17
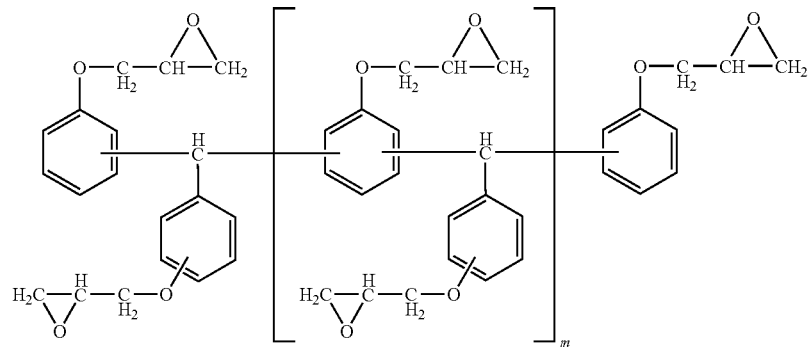
Compound No. 18
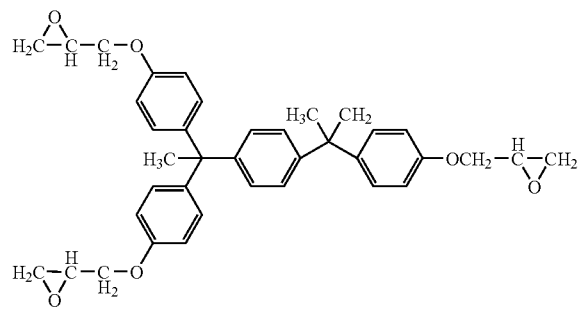
Compound No. 19
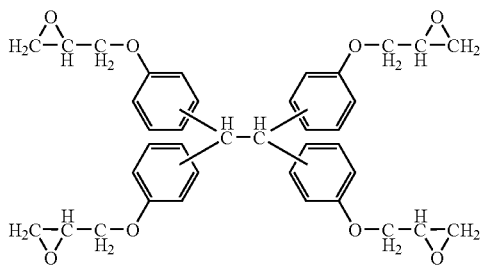
Compound No. 20
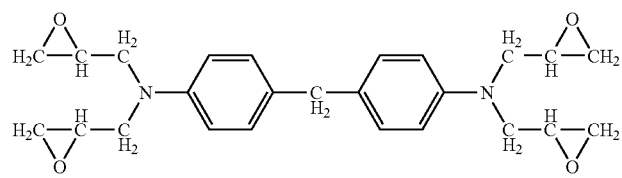

Examples of the unsaturated monobasic acid (B) that can be used to prepare the photopolymerizable unsaturated compound include acrylic acid, methacrylic acid, crotonic acid, cinnamic acid, sorbic acid, hydroxyethyl methacrylate-maleate, hydroxyethyl acrylate-maleate, hydroxypropyl methacrylate-maleate, hydroxypropyl acrylate-maleate, and dicyclopentadiene-maleate. Preferred of them are acrylic acid and methacrylic acid. Examples of the polybasic acid anhydride (D) are the same as those enumerated above with respect to the polybasic acid anhydride (D').

The photopolymerizable unsaturated compound may further be reacted with (H) a polyfunctional epoxy compound. The polyfunctional epoxy compound (H) is used to adjust the acid value thereby to further improve the developability of the alkali-developable resin composition of the invention. Examples of the polyfunctional epoxy compound include monoepoxy compounds such as glycidyl methacrylate, methyl glycidyl ether, ethyl glycidyl ether, propyl glycidyl ether, isopropyl glycidyl ether, butyl glycidyl ether, isobutyl glycidyl ether, t-butyl glycidyl ether, pentyl glycidyl ether, hexyl glycidyl ether, heptyl glycidyl ether, octyl glycidyl ether, nonyl glycidyl ether, decyl glycidyl ether, undecyl glycidyl ether, dodecyl glycidyl ether, tridecyl glycidyl ether, tetradecyl glycidyl ether, pentadecyl glycidyl ether, hexadecyl glycidyl ether, 2-ethylhexyl glycidyl ether, allyl glycidyl ether, propargyl glycidyl ether, p-methoxyethyl glycidyl ether, phenyl glycidyl ether, p-methoxy glycidyl ether, p-butylphenol glycidyl ether, cresyl glycidyl ether, 2-methylcresyl glycidyl ether, 4-nonylphenyl glycidyl ether, benzyl glycidyl ether, p-cumylphenyl glycidyl ether, trityl glycidyl ether, 2,3-epoxypropyl methacrylate, epoxidized soybean oil, epoxidized linseed oil, glycidyl butyrate, vinylcyclohexane monoxide, 1,2-epoxy-4-vinylcyclohexane, styrene oxide, pinene oxide, methylstyrene oxide, cyclohexene oxide, propylene oxide, and compound Nos. 21 and 22 shown below; bisphenol epoxy resins such as the above-described polyfunctional epoxy resins (A) and hydrogenated bisphenol epoxy resins; glycidyl ethers such as ethylene glycol diglycidyl ether, propylene glycol diglycidyl ether, 1,4-butanediol diglycidyl ether, 1,6-hexanediol diglycidyl ether, 1,8-octanediol diglycidyl ether, 1,10-decanediol diglycidyl ether, 2,2-dimethyl-1,3-propanediol diglycidyl ether, diethylene glycol diglycidyl ether, triethylene glycol diglycidyl ether, tetraethylene glycol diglycidyl ether, hexaethylene glycol diglycidyl ether, 1,4-cyclohexanedimethanol diglycidyl ether, 1,1,1-tri(glycidyloxymethyl)propane, 1,1,1-tri(glycidyloxymethyl)ethane, 1,1,1-tri(glycidyloxymethyl)methane, and 1,1,1,1-tetra(glycidyloxymethyl)methane; alicyclic epoxy resins such as 3,4-epoxy-6-methylcyclohexylmethyl 3,4-epoxy-6-methylcyclohexanecarboxylate, 3,4-epoxycyclohexylmethyl 3,4-epoxycyclohexanecarboxylate, and 1-epoxyethyl-3,4-epoxycyclohexane; glycidyl esters such as diglycidyl phthalate, diglycidyl tetrahydrophthalate, and glycidyl dimerate; glycidylamines such as tetraglycidyldiaminodiphenylmethane, triglycidyl-p-aminophenol, and N,N-diglycidylaniline; heterocyclic epoxy resins such as 1,3-diglycidyl-5,5-dimethylhydantoin and triglycidyl isocyanurate; dioxide compounds such as dicyclopentadiene dioxide; naphthalene epoxy resins, triphenylmethane epoxy resins, and dicyclopentadiene epoxy resins.

The solid content of the photopolymerizable unsaturated compound preferably has an acid value of 20 to 120 mgKOH/g. The amount of the polyfunctional epoxy compound (H) to be used is preferably decided so that the above acid value condition may be satisfied.

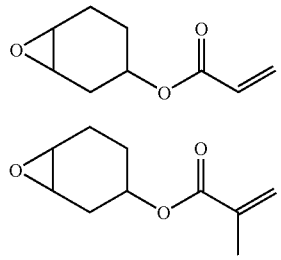

Compound No. 21

Compound No. 22

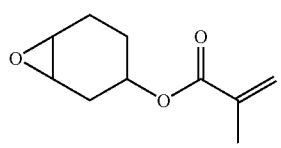

The content of the binder resin obtained by the reactions of the components (A), (B), (D) and, where necessary, (H) in the alkali-developable photosensitive color composition is preferably 1% to 70% by mass, more preferably 3% to 30% by mass, based on the total solids content (components other than the solvent) of the composition.

The photopolymerization initiator that can be used in the alkali-developable photosensitive color composition of the invention can be selected from conventionally known compounds. Examples include benzophenone, phenyl biphenyl ketone, 1-hydroxy-1-benzoylcyclohexane, benzil, benzyl dimethyl ketal, 1-benzyl-1-dimethylamino-1-(4'-morpholinobenzoyl)propane, 2-morpholyl-2-(4'-methylmercapto)benzoylpropane, thioxanthone, 1-chloro-4-propoxythioxanthone, isopropylthioxanthone, diethylthioxanthone, ethylanthraquinone, 4-benzoyl-4'-methyldiphenyl sulfide, benzoin butyl ether, 2-hydroxy-2-benzoylpropane, 2-hydroxy-2-(4'-isopropyl)benzoylpropane, 4-butylbenzoyltrichloromethane, 4-phenoxybenzoyldichloromethane, methyl benzoylformate, 1,7-bis(9'-acridinyl)heptane, 9-n-butyl-3,6-bis(2'-morpholinoisobutyroyl)carbazole, 2-methyl-1-[4-(methylthio)phenyl]-2-morpholinopropan-1-one, 2-methyl-4,6-bis(trichloromethyl)-s-triazine, 2-phenyl-4,6-bis(trichloromethyl)-s-triazine, 2-naphthyl-4,6-bis(trichloromethyl)-s-triazine, and compound Nos. 23 and 24 shown below. Preferred of them are benzophenone and 2-methyl-1-[4-(methylthio)phenyl]-2-morpholinopropan-1-one.

Compound No. 23

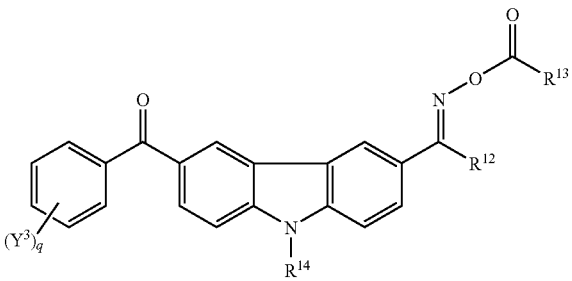

wherein $Y^3$ represents a halogen atom or an alkyl group; $R^{12}$ represents $R^a$, $OR^a$, $COR^a$, $SR^a$, $CONR^aR^b$ or CN; $R^{13}$ represents $R^a$, $OR^a$, $COR^a$, $SR^a$ or $NR^aR^b$; $R^{14}$ represents $R^a$, $OR^a$, $COR^a$, $SR^a$ or $NR^aR^b$; $R^a$ and $R^b$ each represent an alkyl group, an aryl group, an aralkyl group or a heterocyclic group, each of which may be substituted with a halogen atom and/or a heterocyclic group, and the alkyl group and the alkylene moiety of the aralkyl group may be interrupted by an unsaturated bond, an ether linkage, a thioether linkage or an ester linkage; or $R^a$ and $R^b$ may be taken together to form a ring; and q represents a number of from 0 to 4.

Compound No. 24

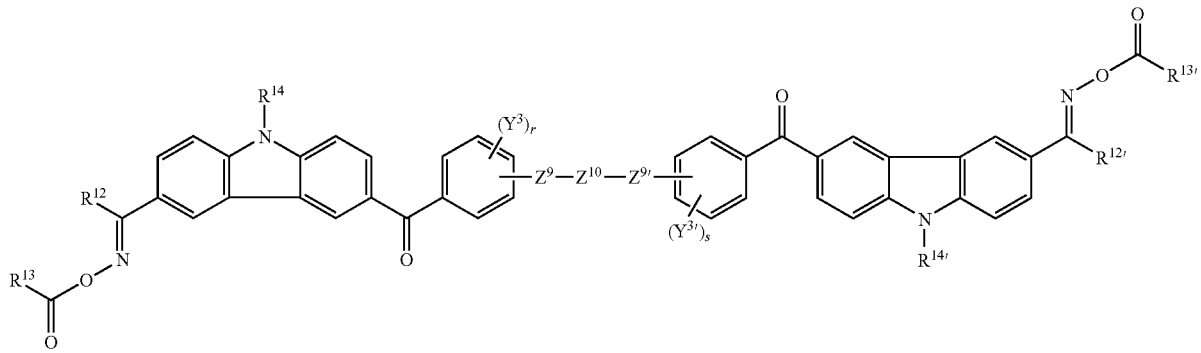

wherein $Y^3$, $R^{12}$, $R^{13}$, $R^{14}$, $R^a$, and $R^b$ each have the same meaning as in compound No. 23; $Y^{3'}$ has the same meaning as $Y^3$; $Z^9$ and $Z^{9'}$ each represent an oxygen atom or a sulfur atom; r and s each represent a number of 1 to 4; $R^{12'}$ has the same meaning as $R^{12}$; $R^{13'}$ has the same meaning as $R^{13}$; $R^{14'}$ has the same meaning as $R^{14}$; and $Z^{10}$ represents a diol residue or a dithiol residue.

The alkali-developable photosensitive color composition of the invention preferably contains the photopolymerization initiator in an amount of from 0.01% to 30% by mass, more preferably 0.5% to 5% by mass, based on the total solids content (components other than the solvent) of the composition.

The colorants that can be used in the alkali-developable photosensitive color composition of the invention include pigments and dyes. There is no particular limitation on which colorant is used. Either one of or both of a pigment and a dye can be used.

Any of known pigments used in the manufacture of conventional color filters can be used as the colorant. A plurality of such pigments can be used in combination to obtain a desired spectrum. The following is a list of useful organic pigments expressed by C.I. number, in which "x" is an optional integer chosen from C.I. numbers.

Pigment Blue:
<C.I.> 1, 1:2, 1:x, 9:x, 15, 15:1, 15:2, 15:3, 15:4, 15:5, 15:6, 16, 24, 24:x, 56, 60, 61, 62

Pigment Green:
<C.I.> 1, 1:x, 2, 2:x, 4, 7, 10, 36

Pigment Orange:
<C.I.> 2, 5, 13, 16, 17:1, 31, 34, 36, 38, 43, 46, 48, 49, 51, 52, 59, 60, 61, 62, 64

Pigment Red:
<C.I.> 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:3, 81:x, 83, 88, 90, 112, 119, 122, 123, 144, 146, 149, 166, 168, 169, 170, 171, 172, 175, 176, 177, 178, 179, 184, 185, 187, 188, 190, 200, 202, 206, 207, 208, 209, 210, 216, 224, 226

Pigment Violet:
<C.I.> 1, 1:x, 3, 3:3, 3:x, 5:1, 19, 23, 27, 32, 42

Pigment Yellow:
<C.I.> 1, 3, 12, 13, 14, 16, 17, 24, 55, 60, 65, 73, 74, 81, 83, 93, 95, 97, 98, 100, 101, 104, 106, 108, 109, 110, 113, 114, 116, 117, 119, 120, 126, 127, 128, 129, 138, 139, 150, 151, 152, 153, 154, 156, 175

Examples of useful black pigments are: #2400, #2350, #2300, #2200, #1000, #980, #970, #960, #950, #900, #850, MCG88, #650, MA600, MA7, MA8, MA11, MA100, MA220, IL30B, IL31B, IL7B, IL11B, IL52B, #4000, #4010, #55, #52, #50, #47, #45, #44, #40, #33, #32, #30, #20, #10, #5, CG9, #3050, #3150, #3250, #3750, #3950, Dia Black A, Dia Black N220M, Dia Black N234, Dia Black I, Dia Black LI, Dia Black LH, Dia Black N339, Dia Black SH, Dia Black SHA, Dia Black LH, Dia Black H, Dia Black HA, Dia Black SC; Dia Black N550M, Dia Black E, Dia Black G, Dia Black R, Dia Black N760M, and Dia Black LR (all manufactured by Mitsubishi Chemical Corp.); Thermax series N990, N991, N907, N908, N990, N991, and N908 (all manufactured by Cancarb Ltd.); ASAHI #80, ASAHI #70, ASAHI #70L, ASAHI G-200, ASAHI #66, ASAHI #66U, ASAHI #50, ASAHI #35, ASAHI #15, and ASAHI Thermal (all manufactured by Asahi Carbon Co., Ltd.); and Color Black Gw200, Color Black Gw2, Color Black Gw2V, Color Black Gw1, Color Black Gw18, Color Black S170, Color Black S160, Special Black 6, Special Black 5, Special Black 4, Special Black 4A, Special Black 250, Special Black 350, Printex U, Printex V, Printex 140U, and Printex 140V (trade names, all produced by Degussa).

Inorganic pigments are also usable, including Milori blue, iron oxide, titanium oxide, calcium carbonate, magnesium carbonate, silica, alumina, cobalt based pigments, manganese based pigments, talc, chromates, ferrocyanides, metal sulfates, metal sulfides, metal selenides, metal phosphates, ultramarine blue, iron blue, cobalt blue, cerulean blue, viridian, emerald green, and cobalt green.

These pigments can be used as a mixture of two or more thereof.

The dyes useful as a colorant include azo dyes, anthraquinone dyes, indigoid dyes, triarylmethane dyes, xanthene dyes, alizarine dyes, acridine dyes, stilbene dyes, thiazole dyes, naphthol dyes, quinoline dyes, nitro dyes, indamine dyes, oxazine dyes, phthalocyanine dyes, and cyanine dyes. These dyes can be used either individually or as a mixture of two or more thereof.

The amount of the colorant in the alkali-developable photosensitive color composition of the invention is preferably 3% to 70% by mass, more preferably 5% to 60% by mass, based on the total solids content (all the components other than the solvent) of the composition.

Examples of the solvent that can be used in the alkali-developable photosensitive color composition include methanol, ethanol, ethyl cellosolve, ethyl cellosolve acetate, diglyme, cyclohexanone, ethylbenzene, xylene, isoamyl acetate, n-amyl acetate, propylene glycol monomethyl ether, propylene glycol monomethyl ether acetate, propylene glycol monoethyl ether, propylene glycol monoethyl ether acetate, diethylene glycol, diethylene glycol monomethyl ether, diethylene glycol monomethyl ether acetate, diethylene glycol monoethyl ether, diethylene glycol monoethyl ether acetate, diethylene glycol monobutyl ether, diethylene glycol monobutyl ether acetate, triethylene glycol, triethylene glycol monomethyl ether, triethylene glycol monomethyl ether acetate, triethylene glycol monoethyl ether, triethylene glycol monoethyl ether acetate, liquid polyethylene glycol, dipropylene glycol monomethyl ether, dipropylene glycol monomethyl ether acetate, dipropylene glycol monoethyl ether, dipropylene glycol monoethyl ether acetate, lactic esters, and ethyl ethoxypropionate.

The amount of the solvent to be used is preferably decided so as to adjust the total solids content of the alkali-developable photosensitive color composition in the range of from 5% to 40% by mass, more preferably from 15% to 30% by mass.

The alkali-developable photosensitive color composition of the present invention may further contain a monomer having an unsaturated bond, a chain transfer agent, a surface active agent, and so forth.

Examples of the monomer having an unsaturated bond include hydroxyl-containing monomers such as 2-hydroxyethyl(meth)acrylate, 2-hydroxypropyl(meth)acrylate, and 2-ethylhexyl(meth)acrylate, and other (meth)acrylic esters such as ethylene glycol di(meth)acrylate, diethylene glycol di(meth)acrylate, triethylene glycol di(meth)acrylate, tetraethylene glycol di(meth)acrylate, tetramethylene glycol di(meth)acrylate, trimethylolpropane tri(meth)acrylate, trimethylolethane tri(meth)acrylate, pentaerythritol di(meth)acrylate, pentaerythritol tri(meth)acrylate, pentaerythritol tetra(meth)acrylate, dipentaerythritol tetra(meth)acrylate, dipentaerythritol hexa(meth)acrylate, and glycerol (meth)acrylate.

The content of the monomer having an unsaturated bond in the alkali-developable photosensitive color composition is preferably 3% to 30% by mass, more preferably 5% to 20% by mass, based on the total solids content (all the components other than the solvent) of the composition.

Examples of the chain transfer agent include mercapto compounds, such as thioglycolic acid, thiomalic acid, thiosalicylic acid, 2-mercaptopropionic acid, 3-mercaptopropionic acid, 3-mercaptobutyric acid, N-(2-mercaptopropionyl)glycine, 2-mercaptonicotinic acid, 3-[N-(2-mercaptoethyl)carbamoyl]propionic acid, 3-[N-(2-mercaptoethyl)amino]propionic acid, N-(3-mercaptopropionyl)alanine, 2-mercaptoethanesulfonic acid, 3-mercaptopropanesulfonic acid, 4-mercaptobutanesulfonic acid, dodecyl (4-methylthio) phenyl ether, 2-mercaptoethanol, 3-mercapto-1,2-propanediol, 1-mercapto-2-propanol, 3-mercapto-2-butanol, mercaptophenol, 2-mercaptoethylamine, 2-mercaptoimidazole, 2-mercapto-3-pyridinol, 2-mercaptobenzothiazole, mercaptoacetic acid, trimethylolpropane tris(3-mercaptopropionate), and pentaerythritol tetrakis(3-mercaptopropionate); disulfide compounds obtained by oxidizing the recited mercapto compounds; and iodized alkyl compounds, such as iodoacetic acid, iodopropionic acid, 2-iodoethanol, 2-iodoethanesulfonic acid, and 3-iodopropanesulfonic acid.

Examples of the surface active agent that can be used include fluorine-containing ones, such as perfluoroalkylphosphoric esters and perfluoroalkylcarboxylic acid salts; anionic ones, such as higher fatty acid alkali salts, alkylsulfonates, and alkylsulfates; cationic ones, such as higher amine halogenic acid salts and quaternary ammonium salts; nonionic ones, such as polyethylene glycol alkyl ethers, polyethylene glycol fatty acid esters, sorbitan fatty acid esters, and fatty acid monoglycerides; amphoteric ones; and silicone surface active agents. These surface active agents can be used either individually or as a combination thereof.

The alkali-developable photosensitive color composition of the invention may further contain a thermoplastic organic polymer to improve the characteristics of its cured product. Examples of the thermoplastic organic polymer include polystyrene, polymethyl methacrylate, a methyl methacrylate-ethyl acrylate copolymer, poly(meth)acrylic acid, a styrene-(meth)acrylic acid copolymer, a (meth)acrylic acid-methyl methacrylate copolymer, polyvinyl butyral, cellulose esters, polyacrylamide, and saturated polyesters.

If desired, the alkali-developable photosensitive color composition of the invention may contain commonly employed additives, such as a thermal polymerization suppressor, such as anisole, hydroquinone, pyrocatechol, tert-butyl catechol, and phenothiazine, a plasticizer, an adhesion accelerator, a filler, a defoaming agent, and a leveling agent.

EXAMPLES

The present invention will now be illustrated in greater detail with reference to Examples, but it should be understood that the invention is not construed as being limited thereto. In Examples hereinafter given, all the percents are by mass.

Preparation Example 1

Preparation of Fluorine-Containing Copolymer No. 1

A mixture of 100 g of Modiper F-600 (fluorine-containing copolymer available from NOF Corp.), 16.4 g of 1,2,3,6-tetrahydrophthalic anhydride, and 400 g of propylene glycol 1-monomethyl ether 2-acetatepropylene glycol-1-monomethyl ether-2-acetate was stirred at 120° C. until the peak assigned to the acid anhydride disappeared to obtain fluorine-containing copolymer No. 1 (mass average molecular weight: 33,000; acid value: 57.9 mgKOH/g) in the form of a solution in propylene glycol 1-monomethyl ether 2-acetatepropylene glycol-1-monomethyl ether-2-acetate.

Preparation Example 2

Preparation of Fluorine-Containing Copolymer No. 2

In the same manner as in Preparation Example 1 except for using 20.7 g of trimellitic anhydride as a polybasic acid anhydride, fluorine-containing copolymer No. 2 (mass average molecular weight: 33,000; acid value: 116 mgKOH/g) was obtained in the form of a solution in propylene glycol 1-monomethyl ether 2-acetatepropylene glycol-1-monomethyl ether-2-acetate.

Preparation Example 3

Preparation of Fluorine-Containing Copolymer No. 3

In the same manner as in Preparation Example 1 except for using 100 g of Modiper F-220 (available from NOF Corp.) as a block copolymer and 19.7 g of trimellitic anhydride as a polybasic acid anhydride, fluorine-containing copolymer No. 3 (mass average molecular weight: 36,000; acid value: 64.5 mgKOH/g) was obtained in the form of a solution in propylene glycol 1-monomethyl ether 2-acetatepropylene glycol-1-monomethyl ether-2-acetate.

Preparation Example 4

Preparation of Fluorine-Containing Copolymer No. 4

In the same manner as in Preparation Example 3 except for using 15.6 g of hexahydrophthalic anhydride as a polybasic acid anhydride, fluorine-containing copolymer No. 4 (mass average molecular weight: 37,000; acid value: 32.6 mgKOH/g) was obtained in the form of a solution in propylene glycol 1-monomethyl ether 2-acetatepropylene glycol-1-monomethyl ether-2-acetate.

Preparation Example 5

Preparation of Fluorine-Containing Copolymer No. 5

In the same manner as in Preparation Example 1 except for using 100 g of Difenser MCF-350SF (available from Dainippon Ink & Chemicals, Inc.) as a block copolymer and 9.9 g of succinic anhydride as a polybasic acid anhydride, fluorine-containing copolymer No. 5 (mass average molecular weight: 38,000; acid value: 56.4 mgKOH/g) was obtained in the form of a solution in propylene glycol 1-monomethyl ether 2-acetatepropylene glycol-1-monomethyl ether-2-acetate.

Preparation Example 6

Preparation of Fluorine-Containing Copolymer No. 6

In the same manner as in Preparation Example 5 except for using 9.9 g of maleic anhydride as a polybasic acid anhydride, fluorine-containing copolymer No. 6 (mass average molecular weight: 42,000; acid value: 58.3 mgKOH/g) was obtained in the form of a solution in propylene glycol 1-monomethyl ether 2-acetatepropylene glycol-1-monomethyl ether-2-acetate.

Preparation Example 7

Preparation of Fluorine-Containing Copolymer No. 7

In the same manner as in Preparation Example 5 except for using 15.6 g of phthalic anhydride as a polybasic acid anhydride, fluorine-containing copolymer No. 7 (mass average molecular weight: 40,000; acid value: 52.4 mgKOH/g) was obtained in the form of a solution in propylene glycol 1-monomethyl ether 2-acetatepropylene glycol-1-monomethyl ether-2-acetate.

Preparation Example 8

Preparation of Binder Resin (Photopolymerizable Unsaturated Compound) No. 1

(1) Preparation of 1,1-bis(4'-hydroxyphenyl)-1-(1"-biphenyl)-1-cyclohexylmethane To a mixture of 70.5 g of biphenylcyclohexyl ketone, 200.7 g of phenol, and 10.15 g of thioacetic acid was added dropwise 40.0 g of trifluoromethanesulfonic acid over a period of 20 minutes at 18° C. After allowing the mixture to react at 17° to 19° C. for 18 hours, 500 g of water was added to stop the reaction. To the reaction mixture was added 500 g of toluene. The organic layer was washed with water until it had a pH of 3 to 4. The organic layer was separated, and toluene, water, and excess phenol were removed therefrom by evaporation. Toluene was added to the residue, and the precipitated solid was collected by filtration and dispersively washed with toluene to give 59.2 g (51%) of pale yellow crystals. The pale yellow crystals were found to have a melting point of 239.5° C. and confirmed to be the title compound.

(2) Preparation of 1,1-bis(4'-epoxypropyloxyphenyl)-1-(1"-biphenyl)-1-cyclohexylmethane To a mixture of 57.5 g of the 1,1-bis(4'-hydroxyphenyl)-1-(1"-biphenyl)-1-cyclohexylmethane obtained in (1) above and 195.8 g of epichlorohydrin was added 0.602 g of benzyltriethylammonium chloride, followed by stirring at 64° C. for 18 hours. The reaction system was allowed to cool to 54° C., and 43.0 g of a 24 mass % aqueous solution of sodium hydroxidesodium hydroxide aqueous solution was added thereto dropwise, followed by stirring for 30 minutes. Epichlorohydrin and water were removed by evaporation, 216 g of methyl isobutyl ketone was added, and the reaction mixture was washed with water. Then, 2.2 g of a 24 mass % aqueous solution of sodium hydroxidesodium hydroxide aqueous solution was added thereto dropwise. The reaction mixture was stirred at 80° C. for 2 hours, cooled to room temperature, neutralized with a 3 mass % aqueous solution of sodium monophosphate, and washed with water. Evaporation of the solvent gave 57 g (79%) of a yellow solid (melting point: 64.2° C.; epoxy equivalent: 282; n=0.04), which was confirmed to be the title compound.

(3) Preparation of Alkali-Developable Resin Composition No. 1

A mixture of 169.5 g of the 1,1-bis(4'-epoxypropyloxyphenyl)-1-(1"-biphenyl)-1-cyclohexylmethane obtained in (2) above as the polyfunctional epoxy resin (A), 44.3 g of acrylic acid as the unsaturated monobasic acid (B), 0.6 g of 2,6-di-tert-butyl-p-cresol, 1.1 g of tetrabutylammonium acetate, and 142.5 g of propylene glycol 1-monomethyl ether 2-acetatepropylene glycol-1-monomethyl ether-2-acetate was stirred at 120° C. for 16 hours. After cooling to room temperature, 71.8 g of propylene glycol 1-monomethyl ether 2-acetatepropylene glycol-1-monomethyl ether-2-acetate, 48.2 g of succinic anhydride as the polybasic acid anhydride (D), and 2.5 g of tetrabutylammonium acetate were added to the reaction mixture, followed by stirring at 100° C. for 5 hours. To the reaction system were further added 50.8 g of the 1,1-bis(4'-epoxypropyloxyphenyl)-1-(1"-biphenyl)-1-cyclohexylmethane obtained in (2) above as the polyfunctional epoxy compound (H) and 21.8 g of propylene glycol 1-monomethyl ether 2-acetatepropylene glycol-1-monomethyl ether-2-acetate, followed by stirring at 120° C. for 12 hours, then at 80° C. for 2 hours, and finally at 40° C. for 2 hours. To the reaction mixture was added 146.3 g of propylene glycol 1-monomethyl ether 2-acetatepropylene glycol-1-monomethyl ether-2-acetate to obtain binder resin No. 1 in the form of a propylene glycol 1-monomethyl ether 2-acetatepropylene glycol-1-monomethyl ether-2-acetate solution.

Preparation Example 9

Preparation of Binder Resin No. 2

A mixture of 43 g of 1,1-bis(4'-epoxypropyloxyphenyl)-1-(1"-biphenyl)-1-cyclohexylmethane as the polyfunctional epoxy resin (A), 33.6 g of acrylic acid as the unsaturated monobasic acid (B), 0.04 g of 2,6-di-tert-butyl-p-cresol, 0.21 g of tetrabutylammonium acetate, and 18 g of propylene glycol 1-monomethyl ether 2-acetatepropylene glycol-1-monomethyl ether-2-acetate was stirred at 120° C. for 13 hours. After cooling to room temperature, 24 g of propylene glycol 1-monomethyl ether 2-acetatepropylene glycol-1-monomethyl ether-2-acetate and 10 g of succinic anhydride as the polybasic acid anhydride (D) were added to the reaction mixture, followed by stirring at 100° C. for 3 hours. To the reaction system was further added 8 g of bisphenol Z glycidyl ether as the polyfunctional epoxy compound (H), followed by stirring at 120° C. for 4 hours, 90° C. for 3 hours, 60° C. for 2 hours, and 40° C. for 5 hours in that order. To the reaction mixture was added 29 g of propylene glycol 1-monomethyl ether 2-acetatepropylene glycol-1-monomethyl ether-2-acetate to obtain binder resin No. 2 in the form of a solution in propylene glycol 1-monomethyl ether 2-acetatepropylene glycol-1-monomethyl ether-2-acetate.

Preparation Example 10

Preparation of Binder Resin No. 3

A mixture of 169.5 g of 1,1-bis(4'-epoxypropyloxyphenyl)-1-(1"-biphenyl)-1-cyclohexylmethane as the polyfunctional epoxy resin (A), 44.3 g of acrylic acid as the unsaturated monobasic acid (B), 0.6 g of 2,6-di-tert-butyl-p-cresol, 1.1 g of tetrabutylammonium acetate, and 142.5 g of propylene glycol 1-monomethyl ether 2-acetatepropylene glycol-1-monomethyl ether-2-acetate was stirred at 120° C. for 16 hours. After cooling to room temperature, 93.1 g of propylene glycol 1-monomethyl ether 2-acetatepropylene glycol-1-monomethyl ether-2-acetate, 74.1 g of hexahydrophthalic anhydride as the polybasic acid anhydride (D), and 2.5 g of tetra-n-butylammonium acetate were added to the reaction mixture, followed by stirring at 70° C. for 4 hours. To the reaction system were further added 31.3 g of ethylene glycol diglycidyl ether as the polyfunctional epoxy compound (H) and 146.3 g of propylene glycol 1-monomethyl ether 2-acetatepropylene glycol-1-monomethyl ether-2-acetate to obtain binder resin No. 3 in the form of a propylene glycol 1-monomethyl ether 2-acetatepropylene glycol-1-monomethyl ether-2-acetate solution.

Preparation Example 11

Preparation of Binder Resin No. 4

(1) Preparation of Bisphenol Z Glycidyl Ether

A mixture of 137 g of bisphenol Z (4,4'-cyclohexylidenebisphenol) and 406.67 g of epichlorohydrin was heated up to 74° C., and 25.52 g of a 48% aqueous solution of sodium hydroxidesodium hydroxide aqueous solution was added thereto dropwise, followed by stirring for 3 hours. To the mixture was further added dropwise 59.56 g of a 48% aqueous solution of sodium hydroxidesodium hydroxide aqueous solution at 50° to 60° C. and 620 to 630 mmHg, followed by stirring for 30 minutes. Under the same surrounding conditions, the mixture was heated to 73° C. to evaporate epichlorohydrin. To the reaction mixture was added 583 g of methyl isobutyl ketone, and 3.04 g of a 48% sodium hydroxide aqueous solution, 13.66 g of ion exchanged water, and 0.16 g of tetrabutylammonium bromide were then added thereto. The mixture was heated to 80° C. and maintained at that temperature for 2 hours. To the mixture was added 233 g of ion exchanged water, followed by stirring at 80° C. for 30 minutes. The organic layer was neutralized with 100 g of a 3% aqueous solution of sodium monophosphate, washed with water, and evaporated at 140° C. to yield the title compound, a polyfunctional epoxy resin A having a cyclohexylidene group.

(2) Preparation of Binder Resin No. 4

A mixture of 94.78 g of the bisphenol Z glycidyl ether obtained in (1) above as the polyfunctional epoxy resin (A), 0.13 g of 2,6-di-tert-butyl-p-cresol, 1.28 g of benzyltriethylammonium chloride, and 128.11 g of methoxypropyl acetate was heated up to 90° C., and 33.33 g of acrylic acid as the unsaturated monobasic acid (B) was added thereto. The resulting mixture was heated to 120° C. and maintained at that temperature for 15 hours. To the reaction mixture were further added 39.41 g of biphthalic dianhydride as the polybasic acid anhydride (D) and 0.13 g of tetrabutylammonium bromide, and the mixture was maintained at 120° C. for 3 hours. The mixture was cooled to 80° C. and maintained at that temperature for 10 hours. The mixture was heated up to 90° C., and 26.33 g of glycidyl methacrylate was added thereto as the polyfunctional epoxy compound (H), followed by heating to 120° C., at which the mixture was maintained for 10 hours. The reaction mixture was cooled to 50° C., and 156 g of methoxypropyl acetate was added thereto to obtain a 35% methoxypropyl acetate solution of the title compound, binder resin No. 4.

Preparation Example 12

Preparation of Binder Resin No. 5

A mixture of 184 g of a bisphenol fluorene epoxy resin (epoxy equivalent: 231) as the polyfunctional epoxy resin (A), 58 g of acrylic acid as the unsaturated monobasic acid (B), 0.26 g of 2,6-di-tert-butyl-p-cresol, 0.11 g of tetrabutylammonium acetate, and 23 g of propylene glycol 1-monomethyl ether 2-acetatepropylene glycol-1-monomethyl ether-2-acetate was stirred at 120° C. for 16 hours. After cooling to room temperature, 35 g of propylene glycol 1-monomethyl ether 2-acetatepropylene glycol-1-monomethyl ether-2-acetate, 59 g of biphthalic dianhydride as the polybasic acid anhydride (D), and 0.24 g of tetra-n-butylammonium bromide were added to the reaction mixture, followed by stirring at 120° C. for 4 hours. To the mixture was added 20 g of tetrahydrophthalic anhydride as the polybasic acid anhydride (D), followed by stirring at 120° C. for 4 hours, 100° C. for 3 hours, 80° C. for 4 hours, 60° C. for 6 hours, and 40° C. for 11 hours in that order. The mixture was diluted with 90 g of propylene glycol 1-monomethyl ether 2-acetatepropylene glycol-1-monomethyl ether-2-acetate to give a propylene glycol 1-monomethyl ether 2-acetatepropylene glycol-1-monomethyl ether-2-acetate solution of the title compound, binder resin No. 5.

Preparation Example 13

Preparation of Binder Resin No. 6

A mixture of 154 g of a bisphenol A epoxy resin (epoxy equivalent: 190) as the polyfunctional epoxy resin (A), 59 g of acrylic acid as the unsaturated monobasic acid (B), 0.26 g of 2,6-di-tert-butyl-p-cresol, 0.11 g of tetrabutylammonium acetate, and 23 g of propylene glycol 1-monomethyl ether 2-acetatepropylene glycol-1-monomethyl ether-2-acetate was stirred at 120° C. for 16 hours. After cooling to room temperature, 365 g of propylene glycol 1-monomethyl ether 2-acetatepropylene glycol-1-monomethyl ether-2-acetate, 67 g of biphthalic dianhydride as the polybasic acid anhydride (D), and 0.24 g of tetra-n-butylammonium bromide were added to the reaction mixture, followed by stirring at 120° C. for 4 hours, 100° C. for 3 hours, 80° C. for 4 hours, 60° C. for 6 hours, and 40° C. for 11 hours in that order. The mixture was diluted with 90 g of propylene glycol 1-monomethyl ether 2-acetatepropylene glycol-1-monomethyl ether-2-acetate to give a propylene glycol 1-monomethyl ether 2-acetatepropylene glycol-1-monomethyl ether-2-acetate solution of an binder resin composition No. 6.

Preparation Example 14

Preparation of Binder Resin No. 7

(1) Preparation of 1,1-bis(4'-hydroxyphenyl)-1-(1"-biphenyl)ethane

A mixture of 75 g of phenol and 50 g of 4-acetylbiphenyl was melted at 60° C., and 5 g of 3-mercaptopropionic acid was added thereto. Hydrogen chloride gas was blown through the mixture for 24 hours while stirring, followed by allowing the mixture to react for 72 hours. The reaction mixture was washed with warm water at 70° C. and heated up to 180° C. under reduced pressure to remove volatile matter. Xylene was added to the residue, and the system was cooled to precipitate crystals, which were collected by filtration and dried under reduced pressure to afford 65 g (68%) of pale yellow crystals. The pale yellow crystals had a melting point of 184° C. and were thus confirmed to be the title compound.

(2) Preparation of 1,1-bis(4'-epoxypropyloxyphenyl)-1-(1''-biphenyl)ethane

Thirty-seven grams of the 1,1-bis(4'-hydroxyphenyl)-1-(1''-biphenyl)ethane obtained in (1) above and 149.5 g of epichlorohydrin were mixed, and 0.45 g of benzyltriethylammonium chloride was added thereto, followed by stirring at 64° C. for 18 hours. The temperature was dropped to 54° C., at which temperature 32.6 g of a 24 mass % aqueous solution of sodium hydroxidesodium hydroxide aqueous solution was added dropwise, followed by stirring for 30 minutes. Epichlorohydrin and water were removed by evaporation, and 140 g of methyl isobutyl ketone was added to the residue. The mixture was washed with water, and 1.7 g of a 24 mass % sodium hydroxide aqueous solution was added thereto dropwise. The mixture was stirred at 80° C. for 2 hours, cooled to room temperature, neutralized with a 3 mass % aqueous solution of sodium monophosphate, and washed with water. Removal of the solvent by evaporation gave 38.7 g (80%) of a yellow viscous liquid (epoxy equivalent: 248; n=0.04). The yellow viscous liquid was confirmed to be the title compound.

(3) Preparation of Binder Resin No. 7

A mixture of 49.6 g of the 1,1-bis(4'-epoxypropyloxyphenyl)-1-(1''-biphenyl)ethane obtained in (2) above as the polyfunctional epoxy resin (A), 14.4 g of acrylic acid as the unsaturated monobasic acid (B), 0.05 g of 2,6-di-tert-butyl-p-cresol, 0.14 g of tetrabutylammonium acetate, and 27.4 g of propylene glycol 1-monomethyl ether 2-acetatepropylene glycol-1-monomethyl ether-2-acetate was stirred at 120° C. for 16 hours. After cooling to room temperature, 41.5 g of propylene glycol 1-monomethyl ether 2-acetatepropylene glycol-1-monomethyl ether-2-acetate and 12.4 g of biphenyltetracarboxylic acid dianhydride as the polybasic acid anhydride (D) were added to the reaction mixture, followed by stirring at 120° C. for 8 hours. To the mixture was further added 7.9 g of tetrahydrophthalic anhydride as the polybasic acid anhydride (D), followed by stirring at 120° C. for 4 hours, 100° C. for 3 hours, 80° C. for 4 hours, 60° C. for 6 hours, and 40° C. for 11 hours in that order. The mixture was diluted with 34 g of propylene glycol 1-monomethyl ether 2-acetatepropylene glycol-1-monomethyl ether-2-acetate to give a propylene glycol 1-monomethyl ether 2-acetatepropylene glycol-1-monomethyl ether-2-acetate solution of the title compound, binder resin No. 7.

Example 1

Preparation of Alkali-Developable Photosensitive Color Composition No. 1

Into 12 g of binder resin No. 1 obtained in Preparation Example 8 were mixed 0.072 g of the propylene glycol 1-monomethyl ether 2-acetatepropylene glycol-1-monomethyl ether-2-acetate solution of fluorine-containing copolymer No. 1 obtained in Preparation Example 1, 1.8 g of benzophenone as a photopolymerization initiator, 3.2 g of carbon black (MA 100 from Mitsubishi Chemical Corp.) as a colorant, 75 g of ethyl cellosolve as a solvent, and 8 g of trimethylolpropane triacrylate as a monomer having an unsaturated bond, and the mixture was stirred well to prepare alkali-developable photosensitive color composition No. 1.

Example 2

Preparation of Alkali-Developable Photosensitive Color Composition No. 2

Into 12 g of binder resin No. 2 obtained in Preparation Example 9 were mixed 0.093 g of the propylene glycol 1-monomethyl ether 2-acetatepropylene glycol-1-monomethyl ether-2-acetate solution of fluorine-containing copolymer No. 1 obtained in Preparation Example 1, 1.8 g of benzophenone, 3.2 g of carbon black (MA 100 from Mitsubishi Chemical Corp.), 75 g of ethyl cellosolve, and 8 g of trimethylolpropane triacrylate, and the mixture was stirred well to prepare alkali-developable photosensitive color composition No. 2.

Example 3

Preparation of Alkali-Developable Photosensitive Color Composition No. 3

Into 12 g of binder resin No. 3 obtained in Preparation Example 10 were mixed 0.073 g of the propylene glycol 1-monomethyl ether 2-acetatepropylene glycol-1-monomethyl ether-2-acetate solution of fluorine-containing copolymer No. 1 obtained in Preparation Example 1, 1.8 g of benzophenone, 3.2 g of carbon black (MA 100 from Mitsubishi Chemical Corp.), 75 g of ethyl cellosolve, and 8 g of trimethylolpropane triacrylate, and the mixture was stirred well to prepare alkali-developable photosensitive color composition No. 3.

Example 4

Preparation of Alkali-Developable Photosensitive Color Composition No. 4

Into 12 g of binder resin No. 4 obtained in Preparation Example 11 were mixed 0.066 g of the propylene glycol 1-monomethyl ether 2-acetatepropylene glycol-1-monomethyl ether-2-acetate solution of fluorine-containing copolymer No. 1 obtained in Preparation Example 1, 1.8 g of benzophenone, 3.2 g of carbon black (MA 100 from Mitsubishi Chemical Corp.), 75 g of ethyl cellosolve, and 8 g of trimethylolpropane triacrylate, and the mixture was stirred well to prepare alkali-developable photosensitive color composition No. 4.

Example 5

Preparation of Alkali-Developable Photosensitive Color Composition No. 5

Into 12 g of binder resin No. 5 obtained in Preparation Example 12 were mixed 0.111 g of the propylene glycol 1-monomethyl ether 2-acetatepropylene glycol-1-monomethyl ether-2-acetate solution of fluorine-containing copolymer No. 1 obtained in Preparation Example 1, 1.8 g of benzophenone, 3.2 g of carbon black (MA 100 from Mitsubishi Chemical Corp.), 75 g of ethyl cellosolve, and 8 g of trimethylolpropane triacrylate, and the mixture was stirred well to prepare alkali-developable photosensitive color composition No. 5.

Example 6

Preparation of Alkali-Developable Photosensitive Color Composition No. 6

Into 12 g of binder resin No. 6 obtained in Preparation Example 13 were mixed 0.060 g of the propylene glycol 1-monomethyl ether 2-acetatepropylene glycol-1-monomethyl ether-2-acetate solution of fluorine-containing copolymer No. 1 obtained in Preparation Example 1, 1.8 g of benzophenone, 3.2 g of carbon black (MA 100 from Mitsubishi Chemical Corp.), 75 g of ethyl cellosolve, and 8 g of trimethylolpropane triacrylate, and the mixture was stirred well to prepare alkali-developable photosensitive color composition No. 6.

Example 7

Preparation of Alkali-Developable Photosensitive Color Composition No. 7

Into 12 g of binder resin No. 7 obtained in Preparation Example 14 were mixed 0.073 g of the propylene glycol 1-monomethyl ether 2-acetatepropylene glycol-1-monomethyl ether-2-acetate solution of fluorine-containing copolymer No. 1 obtained in Preparation Example 1, 1.8 g of benzophenone, 3.2 g of carbon black (MA 100 from Mitsubishi Chemical Corp.), 75 g of ethyl cellosolve, and 8 g of trimethylolpropane triacrylate, and the mixture was stirred well to prepare alkali-developable photosensitive color composition No. 7.

Example 8

Preparation of Alkali-Developable Photosensitive Color Composition No. 8

Into 12 g of binder resin No. 1 obtained in Preparation Example 8 were mixed 0.070 g of the propylene glycol 1-monomethyl ether 2-acetatepropylene glycol-1-monomethyl ether-2-acetate solution of fluorine-containing copolymer No. 2 obtained in Preparation Example 2, 1.8 g of benzophenone, 3.2 g of carbon black (MA 100 from Mitsubishi Chemical Corp.), 75 g of ethyl cellosolve, and 8 g of trimethylolpropane triacrylate, and the mixture was stirred well to prepare alkali-developable photosensitive color composition No. 8.

Example 9

Preparation of Alkali-Developable Photosensitive Color Composition No. 9

Into 12 g of binder resin No. 1 obtained in Preparation Example 8 were mixed 0.072 g of the propylene glycol 1-monomethyl ether 2-acetatepropylene glycol-1-monomethyl ether-2-acetate solution of fluorine-containing copolymer No. 1 obtained in Preparation Example 1, 0.6 g of a halogenated copper phthalocyanine pigment (6YK from Toyo Ink Mfg Co., Ltd.) as a colorant, 1.8 g of benzophenone, 80 g of ethyl cellosolve, and 5.6 g of trimethylolpropane triacrylate, and the mixture was stirred well to prepare alkali-developable photosensitive color composition No. 9.

Example 10

Preparation of Alkali-Developable Photosensitive Color Composition No. 10

Into 12 g of binder resin No. 1 obtained in Preparation Example 8 were mixed 0.072 g of the propylene glycol 1-monomethyl ether 2-acetatepropylene glycol-1-monomethyl ether-2-acetate solution of fluorine-containing copolymer No. 3 obtained in Preparation Example 3, 1.8 g of benzophenone as a photopolymerization initiator, 3.2 g of carbon black (MA100 from Mitsubishi Chemical Corp.) as a colorant, 75 g of ethyl cellosolve as a solvent, and 8 g of trimethylolpropane triacrylate as a monomer having an unsaturated bond, and the mixture was stirred well to prepare alkali-developable photosensitive color composition No. 10.

Example 11

Preparation of Alkali-Developable Photosensitive Color Composition No. 11

Into 12 g of binder resin No. 1 obtained in Preparation Example 8 were mixed 0.072 g of the propylene glycol 1-monomethyl ether 2-acetatepropylene glycol-1-monomethyl ether-2-acetate solution of fluorine-containing copolymer No. 4 obtained in Preparation Example 4, 1.8 g of benzophenone as a photopolymerization initiator, 3.2 g of carbon black (MA100 from Mitsubishi Chemical Corp.) as a colorant, 75 g of ethyl cellosolve as a solvent, and 8 g of trimethylolpropane triacrylate as a monomer having an unsaturated bond, and the mixture was stirred well to prepare alkali-developable photosensitive color composition No. 11.

Example 12

Preparation of Alkali-Developable Photosensitive Color Composition No. 12

Into 12 g of binder resin No. 1 obtained in Preparation Example 8 were mixed 0.072 g of the propylene glycol 1-monomethyl ether 2-acetatepropylene glycol-1-monomethyl ether-2-acetate solution of fluorine-containing copolymer No. 5 obtained in Preparation Example 5, 1.8 g of benzophenone as a photopolymerization initiator, 3.2 g of carbon black (MA 100 from Mitsubishi Chemical Corp.) as a colorant, 75 g of ethyl cellosolve as a solvent, and 8 g of trimethylolpropane triacrylate as a monomer having an unsaturated bond, and the mixture was stirred well to prepare alkali-developable photosensitive color composition No. 12.

Example 13

Preparation of Alkali-Developable Photosensitive Color Composition No. 13

Into 12 g of binder resin No. 2 obtained in Preparation Example 9 were mixed 0.072 g of the propylene glycol 1-monomethyl ether 2-acetatepropylene glycol-1-monomethyl ether-2-acetate solution of fluorine-containing copolymer No. 6 obtained in Preparation Example 6, 1.8 g of benzophenone as a photopolymerization initiator, 3.2 g of carbon black (MA100 from Mitsubishi Chemical Corp.) as a colorant, 75 g of ethyl cellosolve as a solvent, and 8 g of trimethylolpropane triacrylate as a monomer having an unsaturated bond, and the mixture was stirred well to prepare alkali-developable photosensitive color composition No. 13.

Example 14

Preparation of Alkali-Developable Photosensitive Color Composition No. 14

Into 12 g of binder resin No. 5 obtained in Preparation Example 12 were mixed 0.072 g of the propylene glycol 1-monomethyl ether 2-acetatepropylene glycol-1-monomethyl ether-2-acetate solution of fluorine-containing copolymer No. 7 obtained in Preparation Example 7, 1.8 g of benzophenone as a photopolymerization initiator, 3.2 g of carbon black (MA100 from Mitsubishi Chemical Corp.) as a colorant, 75 g of ethyl cellosolve as a solvent, and 8 g of trimethylolpropane triacrylate as a monomer having an unsaturated bond, and the mixture was stirred well to prepare alkali-developable photosensitive color composition No. 14.

Comparative Example 1

Preparation of Alkali-Developable Photosensitive Color Composition No. 15

Into 12 g of binder resin No. 1 obtained in Preparation Example 8 were mixed 0.016 g of a compound having the formula shown below as a fluorine-containing copolymer, 1.8 g of benzophenone, 3.2 g of carbon black (MA100 from Mitsubishi Chemical Corp.), 75 g of ethyl cellosolve, and 8 g of trimethylolpropane triacrylate, and the mixture was stirred well to prepare alkali-developable photosensitive color composition No. 15.

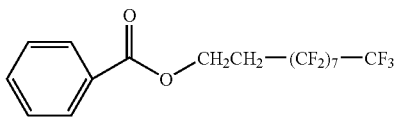

Comparative Example 2

Preparation of Alkali-Developable Photosensitive Color Composition No. 16

Into 12 g of binder resin No. 1 obtained in Preparation Example 8 were mixed 1.8 g of benzophenone, 3.2 g of carbon black (MA100 from Mitsubishi Chemical Corp.), 75 g of ethyl cellosolve, and 8 g of trimethylolpropane triacrylate, and the mixture was stirred well to prepare alkali-developable photosensitive color composition No. 16.

The resulting alkali-developable photosensitive color compositions (Nos. 1 to 16) were evaluated as follows.

A glass substrate was spin coated with γ-glycidoxypropylmethylethoxysilane, and the coat was thoroughly spin-dried. Each of the alkali-developable photosensitive color compositions was applied thereon by spin coating (1300 rpm, 50 seconds), dried, and prebaked at 70° C. for 20 minutes. A 5 mass % polyvinyl alcohol solution was applied thereon and dried at 70° C. for 20 minutes to form an oxygen barrier film. The coated substrate was exposed to light from an ultrahigh pressure mercury lamp, immersed in a 2.5 mass % sodium carbonate solution at 25° C. for 30 seconds (development), thoroughly washed with water, dried, and baked at 230° C. for 1 hour to prepare a test substrate. The contact angle of the carbitol acetate of the test substrate was measured. The results obtained are shown in Table 1 below.

TABLE 1

| Alkali-Developable Photosensitive Color Composition | Contact Angle |
| --- | --- |
| No. 1 (Example 1) | 41° |
| No. 2 (Example 2) | 42° |
| No. 3 (Example 3) | 41° |
| No. 4 (Example 4) | 43° |
| No. 5 (Example 5) | 39° |
| No. 6 (Example 6) | 36° |
| No. 7 (Example 7) | 38° |
| No. 8 (Example 8) | 40° |
| No. 9 (Example 9) | 41° |
| No. 10 (Example 10) | 40° |
| No. 11 (Example 11) | 39° |
| No. 12 (Example 12) | 37° |
| No. 13 (Example 13) | 35° |
| No. 14 (Example 14) | 36° |
| No. 15 (Comp. Example 1) | ≦10° |
| No. 16 (Comp. Example 2) | ≦10° |

All the alkali-developable photosensitive color compositions of Examples 1 to 14 had a contact angle as large as 30° or more, proving excellent in ink repellency. In contrast, the contact angle of the alkali-developable photosensitive color compositions of Comparative Examples 1 and 2 was as small as 10° or less, indicating poor ink repellency.

INDUSTRIAL APPLICABILITY

The alkali-developable photosensitive color composition of the present invention is excellent in ink repellency, alkali developability, sensitivity, resolution, transparency, adhesion, and alkali resistance and is capable of forming a fine pattern with good precision.

What is claimed is:

1. An alkali-developable photosensitive color composition comprising a binder resin, a fluorine-containing copolymer, a photopolymerization initiator, a colorant, and a solvent,
   wherein, the binder resin comprises a photopolymerizable unsaturated compound obtained by adding (B) an unsaturated monobasic acid to (A) a polyfunctional epoxy resin to form (C) an epoxy adduct and reacting the epoxy adduct and (D) a polybasic acid anhydride, and the fluorine-containing copolymer is obtained by modifying part of, or the whole of, hydroxyl groups of (G) a block copolymer with (D') a polybasic acid anhydride, the block copolymer (G) comprising a fluorine containing segment A derived from (E) at least one fluoromonomer and a fluorine-free segment B derived from (F) at least one fluorine-free monomer and having a hydroxyl group in at least one of the segment A and the segment B.

2. The alkali-developable photosensitive color composition according to claim 1, wherein the fluoromonomer (E) is represented by general formula (I)

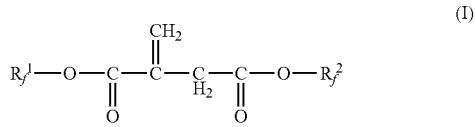

wherein $R_f^1$ and $R_f^2$ each represent a fluoroalkyl group having 1 to 30 carbon atoms and optionally having a hydroxyl group.

3. The alkali-developable photosensitive color composition according to claim 2, wherein the fluorine-free monomer (F) is a (meth)acrylic monomer.

4. The alkali-developable photosensitive color composition according to claim 2, wherein the fluorine-containing copolymer has a fluoromonomer (E) to fluorine-free monomer (F) mass ratio of 10/90 to 80/20.

5. The alkali-developable photosensitive color composition according to claim 2, wherein the fluorine-containing copolymer has a mass average molecular weight of 10,000 to 100,000.

15. The alkali-developable photosensitive color composition according to claim 1, wherein the fluorine-containing copolymer has an acid value of 20 mgKOH/g or more.

16. The alkali-developable photosensitive color composition according to claim 1, wherein the polyfunctional epoxy resin (A) is an alkylidenebisphenol polyglycidyl ether epoxy resin represented by general formula (III):

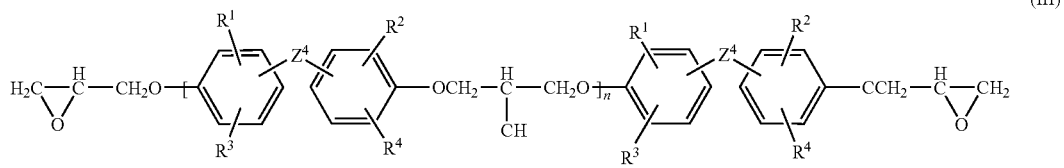

(III)

6. The alkali-developable photosensitive color composition according to claim 1, wherein the fluoromonomer (E) is represented by general formula (II)

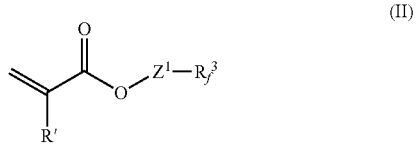

(II)

wherein R' represents a hydrogen atom or a methyl group; $Z^1$ represents a direct bond or a group selected from —R"—NR—SO$_2$—, —R"—NR—CO—, CH$_2$—CH(OH)—CH$_2$—, and —CH$_2$—CH(OH)—CH$_2$—O—; R" represents an alkylene group having 1 to 4 carbon atoms; $R_f^3$ represents a fluoroalkyl group having 1 to 30 carbon atoms and optionally having a hydroxyl group; and R represents a hydrogen atom or an alkyl group having 1 to 30 carbon atoms and optionally having a hydroxyl group.

7. The alkali-developable photosensitive color composition according to claim 6, wherein the fluorine-free monomer (F) is a (meth)acrylic monomer.

8. The alkali-developable photosensitive color composition according to claim 6, wherein the fluorine-containing copolymer has a fluoromonomer (E) to fluorine-free monomer (F) mass ratio of 10/90 to 80/20.

9. The alkali-developable photosensitive color composition according to claim 6, wherein the fluorine-containing copolymer has a mass average molecular weight of 10,000 to 100,000.

10. The alkali-developable photosensitive color composition according to claim 1, wherein the fluorine-free monomer (F) is a (meth)acrylic monomer.

11. The alkali-developable photosensitive color composition according to claim 10, wherein the fluorine-containing copolymer has a fluoromonomer (E) to fluorine-free monomer (F) mass ratio of 10/90 to 80/20.

12. The alkali-developable photosensitive color composition according to claim 10, wherein the fluorine-containing copolymer has a mass average molecular weight of 10,000 to 100,000.

13. The alkali-developable photosensitive color composition according to claim 1, wherein the fluorine-containing copolymer has a fluoromonomer (E) to fluorine-free monomer (F) mass ratio of 10/90 to 80/20.

14. The alkali-developable photosensitive color composition according to claim 1, wherein the fluorine-containing copolymer has a mass average molecular weight of 10,000 to 100,000.

wherein $Z^4$ represents a direct bond, a methylene group, an alkylidene group having 1 to 4 carbon atoms, an alicyclic hydrocarbon group, O, S, SO$_2$, SS, SO, CO, OCO, a substituent represented by formula (AA) or a substituent represented by formula (BB),

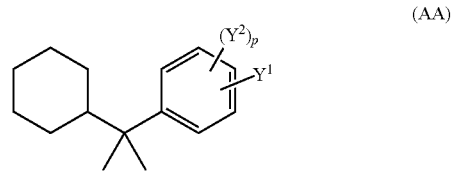

(AA)

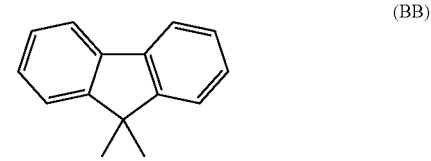

(BB)

wherein the alkylidene group may be substituted with a halogen atom; $R^1$, $R^2$, $R^3$, and $R^4$ each represent a hydrogen atom, an alkyl group having 1 to 5 carbon atoms, an alkoxy group having 1 to 8 carbon atoms, an alkenyl group having 2 to 5 carbon atoms or a halogen atom, wherein the alkyl, the alkoxy, and the alkenyl groups may be substituted with a halogen atom; and n represents an integer of from 0 to 10; wherein $Y^1$ represents a hydrogen atom, a phenyl group which may be substituted with an alkyl or alkoxy group having 1 to 10 carbon atoms, or a cycloalkyl group having 3 to 10 carbon atoms; $Y^2$ represents an alkyl group having 1 to 10 carbon atoms, an alkoxy group having 1 to 10 carbon atoms, an alkenyl group having 2 to 10 carbon atoms or a halogen atom, wherein the alkyl, the alkoxy and the alkenyl groups may be substituted with a halogen atom; and p represents a number of from 0 to 4.

17. The alkali-developable photosensitive color composition according to claim 1, wherein the polyfunctional epoxy resin (A) is a phenol novolak epoxy represented by general formula (IV)

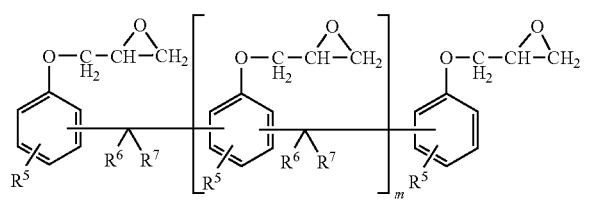

(IV)

wherein $R^5$ represents a hydrogen atom, an alkyl group having 1 to 5 carbon atoms, an alkoxy group having 1 to 8 carbon atoms, an alkenyl group having 2 to 5 carbon atoms, a halogen atom or a (4 glycidyloxyphenyl) 2,2-dimethylmethylidene group, wherein the alkyl, the alkoxy and the alkenyl groups may be substituted with a halogen atom; $R^6$ and $R^7$ each represent a hydrogen atom or a glycidyloxyphenyl group; and m represents an integer of from 0 to 10.

* * * * *